US012652939B2

(12) United States Patent
   Zhang et al.

(10) Patent No.:  US 12,652,939 B2
(45) Date of Patent:        Jun. 9, 2026

(54) DISPLAY PANELS AND DISPLAY DEVICES

(71) Applicant: Shenzhen China Star Optoelectronics Semiconductor Display Technology Co., Ltd., Shenzhen (CN)

(72) Inventors: Haofeng Zhang, Shenzhen (CN); Haibing Shao, Shenzhen (CN); Jing Zhang, Shenzhen (CN); Tianhong Wang, Shenzhen (CN); Jiangbo Yao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 356 days.

(21) Appl. No.: 18/498,158

(22) Filed: Oct. 31, 2023

(65) Prior Publication Data

US 2025/0081823 A1      Mar. 6, 2025

(30) Foreign Application Priority Data

Aug. 30, 2023    (CN) .......................... 202311112067.X

(51) Int. Cl.
   *H10K 59/80*       (2023.01)
   *G02B 30/30*       (2020.01)
(52) U.S. Cl.
   CPC ........... *H10K 59/879* (2023.02); *G02B 30/30* (2020.01); *H10K 59/871* (2023.02)

(58) Field of Classification Search
   CPC .... H10K 59/879; H10K 59/871; G02B 30/30; G02B 30/29; G02B 30/32
   See application file for complete search history.

(56) References Cited

U.S. PATENT DOCUMENTS

2015/0077321 A1*   3/2015   Varekamp ............ H04N 13/376
                                                  345/102
2020/0105827 A1*   4/2020   Subramanya ........ G02B 6/0073

* cited by examiner

*Primary Examiner* — Mohammed R Alam
(74) *Attorney, Agent, or Firm* — PV IP PC; Christopher S. Ruprecht; Wei Te Chung

(57) ABSTRACT

The present disclosure provides a display panel and a display device. The display panel includes a panel body and a light-splitting component; the light-splitting component is disposed on a light-emitting side of the panel body; the light-splitting component includes a plurality of light-splitting members arranged along a first direction, and each of the light-splitting members includes a first side edge and a second side edge opposite to each other along the first direction; for any two adjacent light-splitting members, a distance between the first side edge of one of the light-splitting members and the first side edge of another one of the light-splitting members along the first direction is defined as a preset distance, X, which satisfies the following equation: $X \leq \theta Y$, in which $\theta$ indicates angular resolution of human eye, and Y indicates an optimal viewing distance for the human eye.

20 Claims, 6 Drawing Sheets

DISPLAY PANELS AND DISPLAY DEVICES

CROSS-REFERENCE TO RELATED APPLICATION

This application claims the priority to and benefit of Chinese Patent Application No. 202311112067.X, filed on Aug. 30, 2023, the disclosure of which is incorporated herein by reference in its entirety.

TECHNICAL FIELD

The present disclosure relates to the field of display technology, and in particular, to display panels and display devices.

BACKGROUND

With the rapid development of display technology, liquid crystal display has become the most widely used display technology, and user's requirements for the display technology are increasing, and 3D display devices are also rising. With the emergence of 3D display, naked-eye 3D display has also received great attention. The naked-eye 3D display mainly uses the principle of binocular parallax, that is, by adjusting the optical path of the outgoing light, the left eye of the human eye can receive the left eye image, and the right eye can receive the right eye image, so that people can produce 3D vision.

Currently, in the display panel that is compatible with 2D display and 3D display, light-splitting is often realized through a grating structure or a columnar lens structure for the 3D display. However, the display effect of the display panel that contains the grating structure or the columnar lens structure is affected when the display panel is in a 2D display mode, for example, the resolution of the display panel in the 2D display mode is reduced.

SUMMARY

Embodiments of the present disclosure provide a display panel, including:

a panel body including a display area; and a light-splitting component disposed on a light-emitting side of the panel body and covering at least the display area, in which the light-splitting component includes a plurality of light-splitting members arranged along a first direction, and each of the light-splitting members includes a first side edge and a second side edge disposed opposite to each other along the first direction; for any two adjacent light-splitting members, a distance between the first side edge of one of the two adjacent light-splitting members and the first side edge of another one of the two adjacent light-splitting members along the first direction is defined as a preset distance, X, and the preset distance satisfies the following equation:

$$X \leq \theta Y;$$

in which $\theta$ indicates angular resolution of human eye, and Y indicates an optimal viewing distance for the human eye.

According to the above-mentioned purpose of the present disclosure, embodiments of the present disclosure further provide a display device that includes the above-mentioned display panel.

BRIEF DESCRIPTION OF THE DRAWINGS

The following is a detailed description of specific implementation methods of the present disclosure, in combination with the accompanying drawings, which will render technical solutions and other beneficial effects of the present disclosure clear.

DETAILED DESCRIPTION

The following will provide a clear and complete description of technical solutions in embodiments of the present disclosure in conjunction with the accompanying drawings. Apparently, the described embodiments are only a part of the embodiments of the present disclosure, not all of them. Based on the embodiments in the present disclosure, all other embodiments obtained by those skilled in the art without creative labor fall within the scope of protection in the present disclosure.

The following disclosure provides many different embodiments or examples to implement different structures of the present disclosure. In order to simplify the disclosure of the present disclosure, specific embodiments of components and settings will be described below. Of course, they are only examples and are not intended to limit the present disclosure. Moreover, the present disclosure may repeat reference numbers and/or reference letters in different embodiments for the purpose of simplification and clarity, and does not itself indicate the relationship between the various embodiments and/or settings discussed. Further, the present disclosure provides examples of various specific processes and materials, but ordinary skilled in the art may be aware of the application of other processes and/or the use of other materials.

Figure 1:
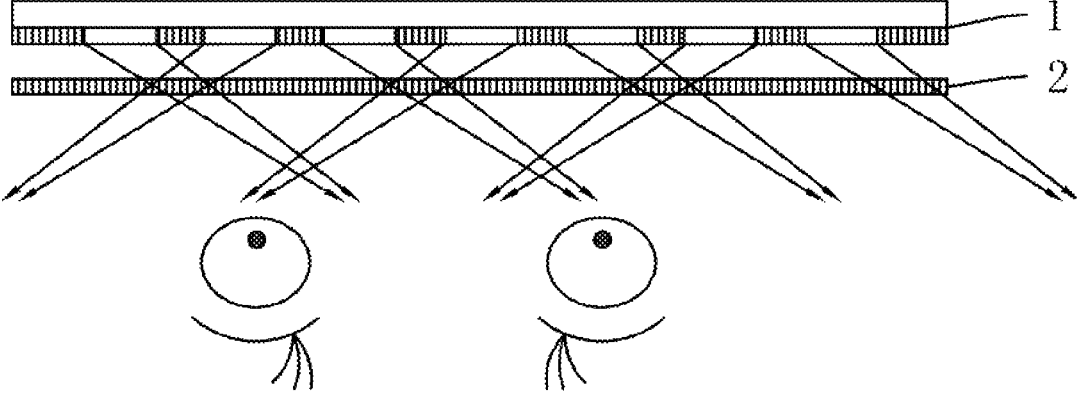
FIG. 1 is a schematic diagram of a display principle of a display panel provided in related art.
Figure 2:
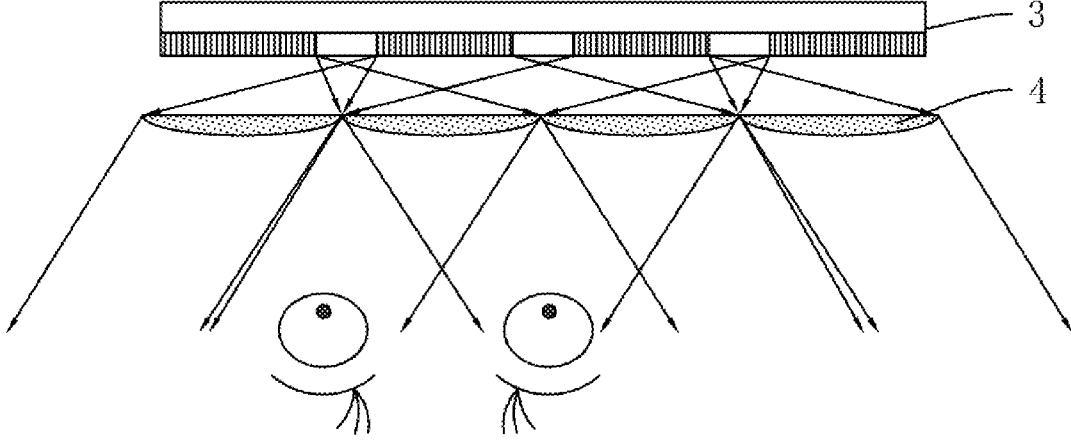
FIG. 2 is another schematic diagram of a display principle of a display panel provided in related art.
Figure 3:
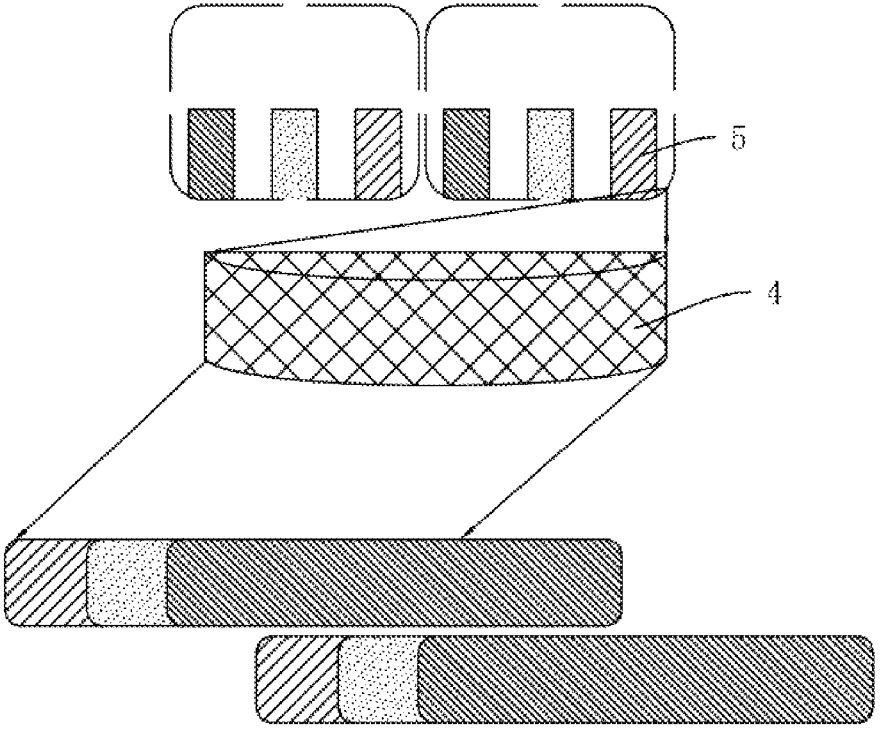
FIG. 3 is a schematic diagram of a display process of a display panel provided in related art.
Figure 3:
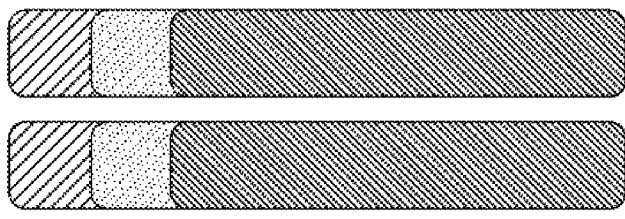

Referring to FIG. 1, a 3D display panel in the related art includes a panel body 1 and a grating structure 2 disposed on a light-emitting side of the panel body 1. Slits in the grating structure 2 can play a light-splitting role in the light output of the panel body 1, allowing light to enter user's left eye and right eye respectively to form a parallax, so that users view the 3D display image. Further, referring to FIG. 2, another 3D display panel in the related art includes a panel body 3 and a lens structure 4 disposed on a light-emitting side of the panel body 3. The lens structure 4 can play a light-splitting role in the light output of the panel body 1, allowing light to enter user's left eye and right eye respectively to form a parallax, so that users view the 3D display image. However, while realizing the 3D display through the grating structure 2 and the lens structure 4, the 2D display effect of the display panel in a 2D display mode would be affected. For example, referring to FIG. 2 and FIG. 3, the lens structure 4 may cover a plurality of pixels 5 in the panel body 3 and enlarge the covered plurality of pixels 5. Since the enlarged plurality of pixels 5 still correspondingly disposed in the area where one lens structure 4 is located in a display state, which in turn leads to the decrease in the delicacy of the display screen, reducing the resolution of the 3D display panel in the 2D display mode.

Figure 4:
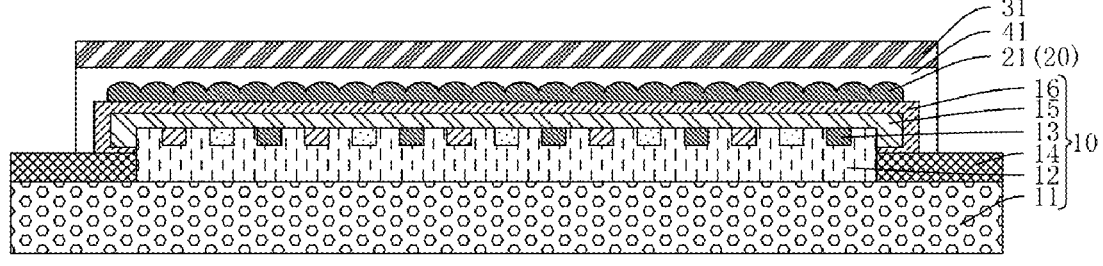
FIG. 4 is a first schematic structural diagram of a display panel according to some embodiments of the present disclosure.
Figure 5:
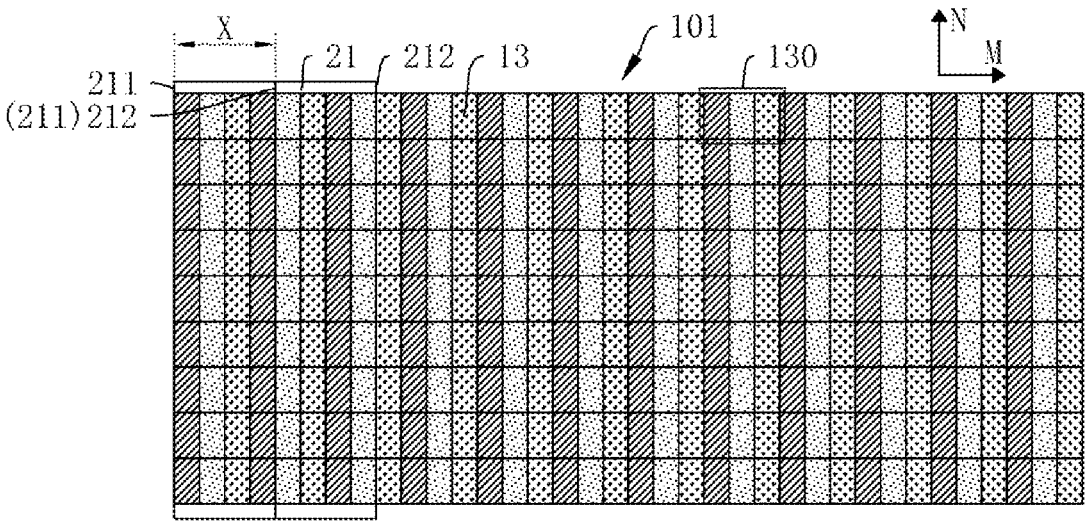
FIG. 5 is a schematic planar distribution diagram of a display panel according to some embodiments of the present disclosure.

Referring to FIG. 4 and FIG. 5, embodiments of the present disclosure provide a display panel that includes a panel body 10 and a light-splitting component 20. The panel body 10 includes a display area 101. The light-splitting component 20 is disposed on a light-emitting side of the panel body 10 and covers at least the display area 101. The light-splitting component 20 includes a plurality of light-splitting members 21 arranged along a first direction M. Each of the light-splitting members 21 includes a first side edge 211 and a second side edge 212 disposed opposite to each other along the first direction M. For any two adjacent light-splitting members 21, a distance between the first side edge 211 of one of the two adjacent light-splitting members 21 and the first side edge 211 of another one of the two adjacent light-splitting members 21 along the first direction M is defined as a preset distance, X, and the preset distance satisfies the following equation:

$$X \le \theta Y.$$

In the above-mentioned equation, $\theta$ indicates angular resolution of human eye, and Y indicates an optimal viewing distance for the human eye.

The display panel provided by the embodiments of the present disclosure, by utilizing an equation containing the angular resolution of human eye $\theta$ and the optimal viewing distance Y for the human eye, obtains the preset distance X that is the ultimate size of the light-splitting members 21 that the human eye can distinguish. The light-splitting members 21 are arranged according to the preset distance X, so that users cannot perceive the presence of the light-splitting members 21 when the display panel is in a 2D display mode, which improves the 2D display effect of the display panel, and makes the display panel compatible with 2D display and 3D display.

Specifically, please continue to refer to FIG. 4 and FIG. 5, the display panel includes the panel body 10, the light-splitting component 20, an adhesive layer, and a cover plate. The light-splitting component 20, the adhesive layer, and the cover plate are disposed on the light-emitting side of the panel body 10.

In the embodiments of the present disclosure, the panel body 10 includes the display area 101. The panel body 10 further includes a substrate 11, a thin film transistor array layer 12 disposed on the substrate 11, a light-emitting functional layer 12 disposed on the thin film transistor array layer 12, a wiring layer 14 disposed on the substrate 11 and connected to the thin film transistor array layer 12, and a first encapsulation layer 15 and a second encapsulation layer 16 covering the light-emitting functional layer. The light-emitting functional layer includes a plurality of sub-pixels 13 disposed within the display area 101. The first encapsulation layer 15 covers the light-emitting functional layer. The second encapsulation layer 16 covers a side of the first encapsulation layer 15 away from the light-emitting functional layer.

In an embodiment, the plurality of sub-pixels 13 may be arranged in an array along the first direction M and a second direction N, and the first direction M intersects with the second direction N. Further, the plurality of sub-pixels 13 may be divided into a plurality of pixels 130 arranged in an array along the first direction M and the second direction N. Each of the pixels 130 includes a plurality of sub-pixels 13 arranged along the first direction M. Each of the pixels 130 including three sub-pixels 13 arranged along the first direction M is taken for an example for illustrating the embodiment of the present disclosure shown in FIG. 4.

In an embodiment, the first direction M and the second direction N may be perpendicular.

In an embodiment, the panel body 10 may be an organic light-emitting diode display panel, the first encapsulation layer 15 may be prepared using organic resin materials, and the second encapsulation layer 16 may be prepared using inorganic water-resistance materials.

Further, the light-splitting component 20 covers at least the display area 101 of the panel body 10 to play a light-splitting role in the entire display area 101, thereby improving the 3D display effect. The light-splitting component 20 includes a plurality of light-splitting members 21 arranged along the first direction M.

In an embodiment, the light-splitting members 21 may include a lens such as a cylindrical lens, or a grating structure. It should be noted that when the light-splitting members 21 includes the cylindrical lens or the grating structure, each of the light-splitting members 21 may be one cylindrical lens or one grating structure, and a plurality of cylindrical lenses or grating structures may be arranged along the first direction M and extend along the second direction N. When the light-splitting members 21 includes the lens, the plurality of light-splitting members 21 are arranged along the first direction M, and each of the light-splitting members 21 includes a plurality of lenses arranged along the second direction N. The light-splitting members 21 being the cylindrical lens is taken for an example for illustration according to the accompanying drawings provided by the embodiments of the present disclosure.

In an embodiment, each of the light-splitting members 21 covers a plurality of columns of sub-pixels 13 arranged along the first direction M, that is, a length of each of the light-splitting members 21 along the first direction M is greater than lengths of n sub-pixels 13 along the first direction M, and n is greater than or equal to 1. The symbol "n" being equal to 4 is taken for an example, as illustrated in FIG. 5 provided by the embodiment of the present disclosure.

Each of the light-splitting members 21 includes a first side edge 211 and a second side edge 212 disposed opposite to each other along the first direction M. In the embodiment of the present disclosure, for any two adjacent light-splitting members 21 in the light-splitting component 20, the distance between the first side edge 211 of one of the light-splitting members 21 along the first direction M and the first side edge 211 of another one of the light-splitting members 21 along the first direction M is defined as the preset distance X. The display panel provided by the embodiments of the present disclosure, by designing the preset distance X, prevents users from perceiving the presence of the light-splitting members 21 when the display panel is in the display state, and avoids the decrease of the display effect of the display panel in the 2D display mode due to the presence of the light-splitting members 21.

It should be noted that the preset distance X is the length of each of the light-splitting members 21 along the first direction M. In the drawings provided by the embodiments of the present disclosure, any adjacent light-splitting members 21 are adjacent to each other along the first direction. However, in other embodiments of the present disclosure, the adjacent light-splitting members 21 may be disposed at intervals, or selected according to actual requirements, which is not limited here.

Figure 6:
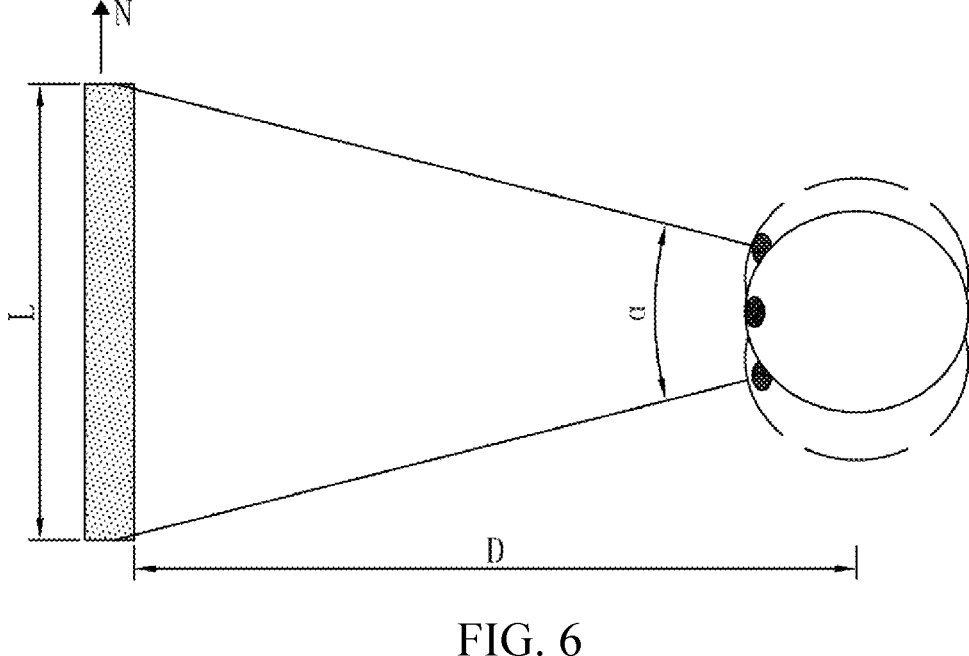
FIG. 6 is a schematic diagram at a viewing angle of a display panel according to some embodiments of the present disclosure.

Specifically, please refer to FIG. 4, FIG. 5, and FIG. 6. In the embodiments of the present disclosure, the preset distance X needs to satisfy the following equation:

$$X \le \theta\, Y.$$

In the above-mentioned equation, $\theta$ indicates the angular resolution of human eye, and Y indicates the optimal viewing distance for the human eye.

In an embodiment, the optimal viewing distance for the human eye, Y, satisfies the following equation:

$$Y = \dfrac{L}{2 \tan\!\left(\dfrac{\alpha}{360°}\pi\right)}.$$

In the above-mentioned equation, L indicates a length of the display area 101 along the first direction M, and $\alpha$ indicates a maximum viewing angle of single eye movement of the human eye.

According to the Rayleigh Criterion, the angular resolution of the human eye $\theta$ is defined as follows:

$$\theta \approx \sin\theta = 1.220\,\dfrac{\lambda}{d} = 1.220\,\dfrac{555 \times 10^{-9}}{5 \times 10^{-3}} = 0.000135 \text{ (rad)}.$$

In the above-mentioned equation, $\lambda$ indicates the wavelength of light, and d indicates a diameter of human iris.

After testing and validating, an embodiment of the present disclosure obtains the maximum viewing angle of single eye movement of the human eye $\alpha$, which is 73°.

Based on the above, the preset distance X needs to satisfy the following equation:

$$X \le \theta\,\dfrac{L}{2 \tan\!\left(\dfrac{\alpha}{360°}\pi\right)} = 0.000135\,\dfrac{L}{2 \tan 0.2028\,\pi}.$$

Therefore, in some embodiments of the present disclosure, based on various sizes of the panel body 10, the length L of the panel body 10 along the first direction M can be obtained to obtain the ultimate resolution size $$\left(0.000135\,\dfrac{L}{2 \tan 0.2028\,\pi}\right).$$

In view of foregoing, during the arrangement and setting process of the light-splitting members 21 provided by the embodiments of the present disclosure, for any two adjacent light-splitting members 21, the distance between the first side edge 211 of one of the light-splitting members 21 along the first direction M and the first side edge 211 of another one of the light-splitting members 21 along the first direction M is defined as the preset distance X. By designing X to be less than the maximum resolution size of the human eye, users cannot perceive the presence of the light-splitting members 21 when the display panel is in the 2D display mode, which effectively improves the resolution and display effect of the display panel in the 2D display mode, while making the display panel compatible with 2D display and 3D display.

In an embodiment, the preset distance X is less than or equal to 30 microns.

Further, referring to FIG. 4, FIG. 5, and FIG. 6, the present disclosure designs the size and spacing distance of the light-splitting members 21, as illustrated in some embodiments. Based on the length relationship between each of the light-splitting members 21 and the sub-pixels 13 along the first direction M, for example in an embodiment, a sub-pixel size $S_1$ of each of the sub-pixels 13 needs to satisfy the following equation, in which n indicates the number of sub-pixels 13 along the first direction M:

$$S_1 \le \dfrac{1}{n}X.$$

Moreover, a pixel size $S_2$ of each of the pixels 130 needs to satisfy the following equation:

$$S_2 \le \dfrac{m}{n}X.$$

In the above-mentioned equation, $S_2$ indicates the pixel size, n indicates the number of sub-pixels 13 along the first direction M and m indicates the number of sub-pixels 13 in each of the pixels 130.

In an embodiment, n can be equal to 4, and m can be equal to 3, then the sub-pixel size $S_1$ needs to be less than or equal to one-fourth of the preset distance X, and the pixel size $S_2$ needs to be less than or equal to three-quarters of the preset distance X.

Further, based on the pixel size $S_2$ mentioned above, the pixel density P of the panel body 10 provided by the embodiments of the present disclosure needs to satisfy the following equation:

$$P > \frac{L}{S_2}$$

According to various sizes of the panel body 10, the panel body 10 may have various types. Specifically, the panel body 10 having different ratios of side edges may be provided, such as 4:3, 16:9, and 16:10. For example, 4:3 indicates the ratio of the length of the display area 101 along the first direction M to the length of the display area 101 along the second direction N, and 16:9 and 16:10 have the same meanings as 4:3.

In an embodiment, when the ratio of the side edges of the display area 101 is 4:3, the pixel density P may satisfy the following equation:

$$P \geq \frac{5}{4} \times \frac{L}{S_2}.$$

In an embodiment, when the ratio of the side edges of the display area 101 is 16:9, the pixel density P may satisfy the following equation:

$$P \geq \frac{183.6}{16} \times \frac{L}{S_2}.$$

In an embodiment, when the ratio of the side edges of the display area 101 is 16:10, the pixel density P may satisfy the following equation:

$$P \geq \frac{18.87}{16} \times \frac{L}{S_2}.$$

Moreover, according to the equations for the size arrangement and the pixel density P of the light-splitting members 21 provided by the embodiments of the present disclosure, some embodiments of the present disclosure further provide a plurality of panel body samples with various sizes and parameters, and calculate the parameters of the panel body samples according to the equations provided by the embodiments of the present disclosure, to obtain the display panels having the following parameters that can be compatible with 2D display and 3D display, and the results are shown in tables 1 and 2 below.

TABLE 1

| | | Actual parameters of panel body samples | |
|---|---|---|---|
| Inch | Resolution | Pixels per inch (PPI) | Size of pixels (μm) |
| 6.2 | 2K | 405.4551 | 60.46507 |
| 14 | 4K | 323.4508 | 80.71153 |
| 15.6 | 4K | 296.8358 | 84.31472 |
| 16 | 4K | 289.4149 | 86.47664 |
| 17.3 | 4K | 267.667 | 93.50286 |
| 21 | 4K | 220.5066 | 113.5006 |
| 27 | 4K | 171.5051 | 145.9293 |
| 32 | 8K | 275.3634 | 92.24174 |
| 65 | 8K | 135.5635 | 187.366 |

TABLE 2

| | Calculated parameters of the panel body samples provided by the embodiments of the present disclosure | | | | | |
|---|---|---|---|---|---|---|
| Viewing distance | The ultimate resolution size of the human eye | X | P | $S_2$ | Target resolution | Suggested resolution |
| 0.25 | 45 | 45 | 33.75 | 33.75 | 4213.5 | 4K |
| 0.35 | 63 | 63 | 47.25 | 47.25 | 6559.41 | 7K |
| 0.4 | 72 | 72 | 54 | 54 | 6490.58 | 7K |
| 0.4 | 72 | 72 | 60.75 | 54 | 6657.01 | 7K |
| 0.4 | 72 | 72 | 67.5 | 54 | 7197.89 | 7K |
| 0.4 | 72 | 72 | 81 | 54 | 8737.32 | 10K |
| 0.4 | 72 | 72 | 94.5 | 54 | 11233.7 | 12K |
| 0.45 | 81 | 81 | 121.5 | 60.75 | 11661.18 | 12K |
| 0.9 | 162 | 162 | 243 | 121.5 | 11843.38 | 12K |

It should be noted that the plurality of rows of the data in table 2 correspond to the plurality of rows of the data in table 1, that is, table 2 can be merged to the right side of table 1, so that each row of data in table 2 corresponds to each row of data in table 1.

In view of foregoing, the display panel provided by the embodiments of the present disclosure, by utilizing X calculated according to equations containing the angular resolution of human eye θ and the optimal viewing distance Y for the human eye, in which X is the ultimate size of the light-splitting members 21 that the human eye can distinguish, and arranging the light-splitting members 21 according to the preset distance X, users cannot perceive the presence of the light-splitting members 21 when the display panel is in the 2D display mode, which improves the 2D display effect of the display panel. Moreover, the embodiments of the present disclosure further design the value of the pixel density P based on the ultimate size of the light-splitting members 21, and adjust the arrangement of the pixels 130 to improve the resolution of the display panel and the matching relationship between the pixels 130 and the light-splitting members 21, so that the display panel provided by the embodiments of the present disclosure is compatible with 2D display and 3D display.

Specific structures of the display panel provided by the embodiments of the present disclosure will be illustrated in conjunction with specific embodiments in the following.

Referring to FIG. 4, in an embodiment of the present disclosure, the display panel includes the light-splitting component 20, a first adhesive layer 41, and a first cover plate 31 disposed on a light-emitting side of the panel body 10.

The light-splitting component 20 is disposed between the panel body 10 and the first cover plate 31, and between the panel body 10 and the first adhesive layer 41. The light-splitting component 20 is disposed on a surface of the panel body 10 close to the first adhesive layer 41 and the first cover plate 31. The first adhesive layer 41 covers the light-splitting component 20. The first cover plate 31 is attached onto a light-emitting side of the first cover plate 31 through the first adhesive layer 41.

Figure 7:
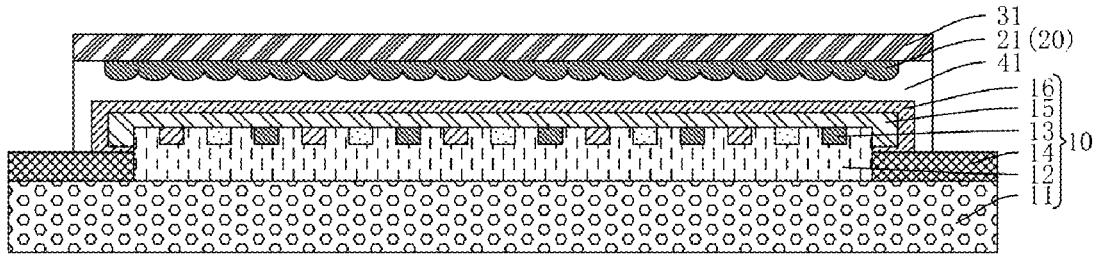
FIG. 7 is a second schematic structural diagram of a display panel according to some embodiments of the present disclosure.

Referring to FIG. 7, in an embodiment of the present disclosure, the display panel includes the light-splitting component 20, the first adhesive layer 41, and the first cover plate 31, which are disposed on the light-emitting side of the panel body 10.

The light-splitting component 20 is disposed on a surface of the first cover plate 31 close to the panel body 10. The first adhesive layer 41 covers the light-splitting component 20 and is disposed between the first cover plate 31 and the panel body 10. The first cover plate 31 is attached onto the light-emitting side of the panel body 10 through the first adhesive layer 41.

Figure 8:
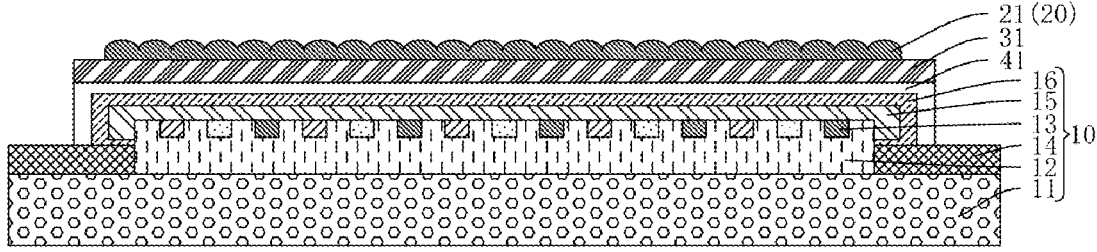
FIG. 8 is a third schematic structural diagram of a display panel according to some embodiments of the present disclosure.

Referring to FIG. 8, in an embodiment of the present disclosure, the display panel includes the light-splitting component 20, the first adhesive layer 41, and the first cover plate 31 that are disposed on the light-emitting side of the panel body 10.

The first adhesive layer 41 is disposed between the first cover plate 31 and the panel body 10. The first cover plate 31 is attached onto the light-emitting side of the panel body 10 through the first adhesive layer 41. The light-splitting component 20 is disposed on a surface of the first cover plate 31 away from the panel body 10.

Figure 9:
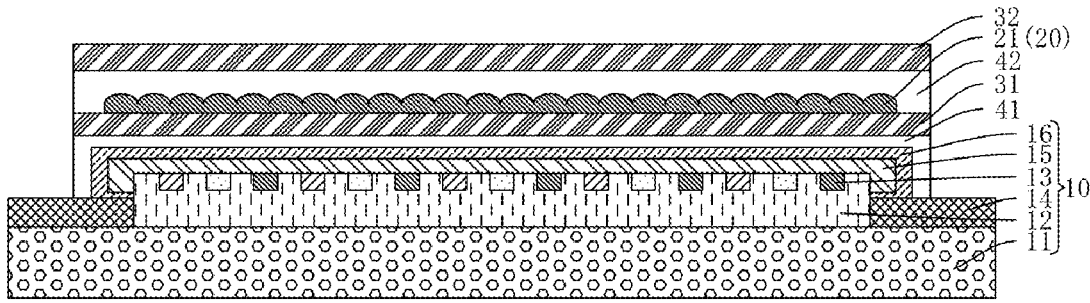
FIG. 9 is a fourth schematic structural diagram of a display panel according to some embodiments of the present disclosure.

Referring to FIG. 9, in an embodiment of the present disclosure, the display panel includes the light-splitting component 20, the first cover plate 31, a second cover plate 32, the first adhesive layer 41, and a second adhesive layer 42 that are disposed on the light-emitting side of the panel body 10.

The first adhesive layer 41 is disposed between the first cover plate 31 and the panel body 10. The first cover plate 31 is attached onto the light-emitting side of the panel body 10 through the first adhesive layer 41. The light-splitting component 20 is disposed on a surface of the first cover plate 31 away from the panel body 10. The second adhesive layer 42 is disposed on a side of the first cover plate 31 away from the panel body 10 and covers the light-splitting component 20. The second cover plate 32 is disposed on a side of the second adhesive layer 42 away from the first cover plate 31 and attached onto a side of the first cover plate 31 away from the panel body 10 through the second adhesive layer 42.

Figure 10:
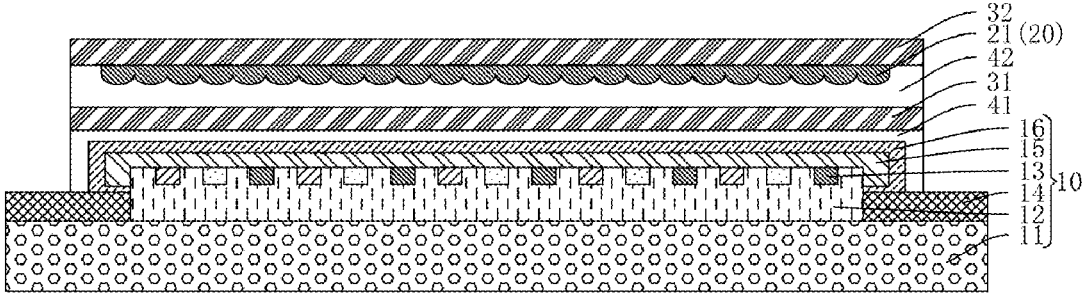
FIG. 10 is a fifth structural schematic diagram of a display panel according to some embodiments of the present disclosure.

Referring to FIG. 10, in an embodiment of the present disclosure, the display panel includes the light-splitting component 20, the first cover plate 31, the second cover plate 32, the first adhesive layer 41, and the second adhesive layer 42 that are disposed on the light-emitting side of the panel body 10.

The first adhesive layer 41 is disposed between the first cover plate 31 and the panel body 10. The first cover plate 31 is attached onto the light-emitting side of the panel body 10 through the first adhesive layer 41. The second cover plate 32 is disposed on a side of the first cover plate 31 away from the panel body 10. The light-splitting component 20 is disposed on a surface of the second cover plate 32 close to the first cover plate 31. The second adhesive layer 42 is disposed between the first cover plate 31 and the second cover plate 32 and covers the light-splitting component 20. The second cover plate 32 is attached onto a side of the first cover plate 31 away from the panel body 10 through the second adhesive layer 42.

Figure 11:
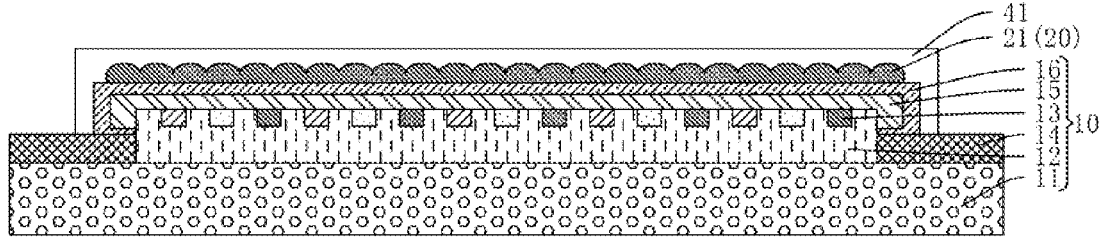
FIG. 11 is a sixth structural schematic diagram of a display panel according to some embodiments of the present disclosure.

Referring to FIG. 11, in an embodiment of the present disclosure, the display panel includes the light-splitting component 20 and the first adhesive layer 41 that are disposed on the light-emitting side of the panel body 10.

The light-splitting component 20 is disposed on a surface of the panel body 10 close to the first adhesive layer 41. The first adhesive layer 41 is disposed on the light-emitting side of the panel body 10 and covers the light-splitting component 20, so as to provide encapsulation and protection effects for the light-splitting component 20.

Figure 12:
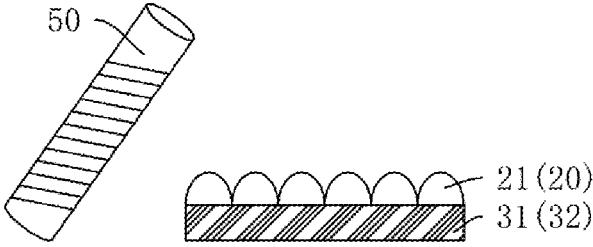
FIG. 12 is a schematic structural diagram of a process of a display panel according to some embodiments of the present disclosure.

It should be noted that, in the manufacturing processes of the display panels shown in FIG. 4 and FIG. 11, a light-splitting material layer is formed on the panel body 10, and then patterned to form the light-splitting component 20 by a photolithography process. Moreover, please refer to FIG. 12, in the manufacturing processes of the display panels shown in FIG. 7, FIG. 8, FIG. 9, and FIG. 10, a light-splitting material layer is respectively formed on a surface of the first cover plate 31 or a surface of the second cover plate 32, and then rolled and pressed by the roller wheel 50, so that the light-splitting material layer is patterned to form the light-splitting component 20. Subsequently, the first cover plate 31 or the second cover plate 32 provided with the light-splitting component 20 is attached onto the light-emitting side of the panel body 10.

Based on the above, the display panel provided by the embodiments of the present disclosure, by utilizing X obtained according to the equations containing the angular resolution of human eye θ and the optimal viewing distance Y for the human eye, in which X is the ultimate size of the light-splitting members 21 that the human eye can distinguish, arranging the light-splitting members 21 according to the preset distance X, users cannot perceive the presence of the light-splitting members 21 when the display panel is in the 2D display mode, which improves the 2D display effect of the display panel. Moreover, the embodiments of the present disclosure further design the value of the pixel density P based on the ultimate size of the light-splitting members 21, and adjust the arrangement of the pixels 130 to improve the resolution of the display panel and the matching relationship between the pixels 130 and the light-splitting members 21, so that the display panel provided by the embodiments of the present disclosure is compatible with 2D display and 3D display.

Moreover, the embodiments of the present disclosure further provide a display device that includes the display panel as described in any one of the above-mentioned embodiments.

When the display device provided by the embodiments of the present disclosure has the same display panel as in the above-mentioned embodiments, the display device provided by the embodiments of the present disclosure has the same beneficial effect as the display panel in the above-mentioned embodiments.

In the above-mentioned embodiments, the description of each embodiment has its own emphasis. For the parts that are not detailed in an embodiment, please refer to the relevant descriptions of other embodiments.

The display panel and the display device provided by the embodiments of the present disclosure are described in detail. In this context, specific embodiments are adopted to illustrate a principle and implementation modes of the present disclosure. The description of the above-mentioned embodiments is only used to help understand methods and a core idea of the present disclosure. At the same time, for those skilled in the art, according to the idea of the present disclosure, there might be changes in specific implementation modes and a scope of the present disclosure, which falls within the scope of the protection of the present disclosure. In conclusion, contents of the specification should not be interpreted as a limitation of the present disclosure.

What is claimed is:

1. A display panel, comprising:
    a panel body comprising a display area; and
    a light-splitting component disposed on a light-emitting side of the panel body and covering at least the display area, wherein the light-splitting component comprises a plurality of light-splitting members arranged along a first direction, and each of the light-splitting members comprises a first side edge and a second side edge disposed opposite to each other along the first direction;
    for any two adjacent light-splitting members, a distance between the first side edge of one of the two adjacent light-splitting members and the first side edge of another one of the two adjacent light-splitting members along the first direction is defined as a preset distance, X, and the preset distance satisfies the following equation:

$$X \leq \theta\, Y;$$

wherein θ indicates angular resolution of human eye, and Y indicates an optimal viewing distance for the human eye.

2. The display panel of claim 1, wherein the optimal viewing distance for the human eye, Y, satisfies the following equation:

$$Y = \frac{-L}{2\tan\left(\frac{\alpha}{360°}\pi\right)};$$

wherein L indicates a length of the display area along the first direction, and α indicates a maximum viewing angle of single eye movement of the human eye.

3. The display panel of claim 2, wherein θ is 0.000135 Rad, and α is 73°.

4. The display panel of claim 1, wherein the panel body comprises a plurality of pixels arranged along the first direction and a second direction, the second direction intersects with the first direction; each of the pixels comprises a plurality of sub-pixels arranged along the first direction, and a length of each of the light-splitting members along the first direction is greater than or equal to a sum of lengths of n sub-pixels along the first direction, wherein n is greater than or equal to 1.

5. The display panel of claim 4, wherein a sub-pixel size satisfies the following equation:

$$S_1 \leq \frac{1}{n}X;$$

wherein $S_1$ indicates the sub-pixel size of each of the sub-pixels; and
a pixel size satisfies the following equation:

$$S_2 \leq \frac{m}{n}X;$$

wherein $S_2$ indicates the pixel size of each of the pixels, and m indicates a number of the sub-pixels in each of the pixels.

6. The display panel of claim 5, wherein a pixel density of the panel body satisfies the following equation:

$$P > \frac{L}{S_2};$$

wherein P indicates the pixel density, and L indicates a length of the display area along the first direction.

7. The display panel of claim 1, wherein X is less than or equal to 30 microns.

8. The display panel of claim 1, further comprising a first cover plate disposed on the light-emitting side of the panel body, wherein the light-splitting component is disposed on a side of the first cover plate close to the panel body, or the light-splitting component is disposed on a side of the first cover plate away from the panel body.

9. The display panel of claim 8, wherein the light-splitting component is disposed on a surface of the panel body close to the first cover plate.

10. The display panel of claim 8, wherein the light-splitting component is disposed on a surface of the first cover plate close to the panel body, or the light-splitting component is disposed on a surface of the first cover plate away from the panel body.

11. The display panel of claim 8, further comprising a second cover plate disposed on the light-emitting side of the panel body and opposite to the first cover plate, wherein the light-splitting component is disposed between the first cover plate and the second cover plate.

12. The display panel of claim 11, wherein the light-splitting component is disposed on a surface of the first cover plate close to the second cover plate, or the light-splitting component is disposed on a surface of the second cover plate close to the first cover plate.

13. The display panel of claim 1, wherein the light-splitting members comprise one of a grating structure and a lens.

14. A display device comprising a display panel, wherein the display panel comprises:
   a panel body comprising a display area; and
   a light-splitting component disposed on a light-emitting side of the panel body and covering at least the display area, wherein the light-splitting component comprises a plurality of light-splitting members arranged along a first direction, and each of the light-splitting members comprises a first side edge and a second side edge disposed opposite to each other along the first direction; for any two adjacent light-splitting members, a distance between the first side edge of one of the two adjacent light-splitting members and the first side edge of another one of the two adjacent light-splitting members along the first direction is defined as a preset distance, X, and the preset distance satisfies the following equation:

$$X \leq \theta\, Y;$$

wherein θ indicates angular resolution of human eye, and Y indicates an optimal viewing distance for the human eye.

15. The display device of claim 14, wherein the optimal viewing distance for the human eye Y satisfies the following equation:

$$\frac{L}{2\tan\left(\frac{\alpha}{360°}\pi\right)};$$

wherein L indicates a length of the display area along the first direction, and α indicates a maximum viewing angle of single eye movement of the human eye.

16. The display device of claim 15, wherein θ is 0.000135 Rad, and α is 73°.

17. The display device of claim 14, wherein the panel body comprises a plurality of pixels arranged along the first direction and a second direction, the second direction intersects with the first direction; each of the pixels comprises a plurality of sub-pixels arranged along the first direction, and a length of each of the light-splitting members along the first direction is greater than or equal to a sum of lengths of n sub-pixels along the first direction, wherein n is greater than or equal to 1.

18. The display device of claim 17, wherein a sub-pixel size satisfies the following equation:

$$S_1 \leq \frac{1}{n}X;$$

wherein $S_1$ indicates the sub-pixel size of each of the sub-pixels; and a pixel size satisfies the following equation:

$$S_2 \leq \frac{m}{n}X;$$

wherein $S_2$ indicates the pixel size of each of the pixels, and m indicates a number of the sub-pixels in each of the pixels.

19. The display device of claim 18, wherein a pixel density of the panel body satisfies the following equation:

$$P > \frac{L}{S_2};$$

wherein P indicates the pixel density, and L indicates a length of the display area along the first direction.

20. The display device of claim 14, wherein X is less than or equal to 30 microns.

* * * * *